United States Patent
Hsu et al.

(10) Patent No.: US 7,425,139 B2
(45) Date of Patent: Sep. 16, 2008

(54) FIXATION STRUCTURE FOR FIXING A LAMP ON A PRINTED CIRCUIT BOARD

(75) Inventors: Cheng-Chia Hsu, Chupei (TW); Teng-Kang Chang, Jhudong Township, Hsinchu County (TW); Yu-Cheng Pan, Houlong Township, Miaoli County (TW)

(73) Assignee: Logah Technology Corp., Hsinchu (TW)

( * ) Notice: Subject to any disclaimer, the term of this patent is extended or adjusted under 35 U.S.C. 154(b) by 28 days.

(21) Appl. No.: 11/554,805

(22) Filed: Oct. 31, 2006

(65) Prior Publication Data

US 2008/0102694 A1   May 1, 2008

(51) Int. Cl.
*H01R 12/00* (2006.01)
(52) U.S. Cl. .................. 439/82; 439/617; 439/825; 439/915
(58) Field of Classification Search .............. 439/54, 439/56, 617, 618, 82, 825, 884, 915
See application file for complete search history.

(56) References Cited

U.S. PATENT DOCUMENTS

| 1,684,973 | A | * | 9/1928 | Sears | 439/521 |
| 2,042,199 | A | * | 5/1936 | Thomas | 362/659 |
| 2,977,562 | A | * | 3/1961 | Benson | 439/58 |
| 3,121,185 | A | * | 2/1964 | Poels et al. | 313/318.05 |
| 3,229,083 | A | * | 1/1966 | George, Jr. | 362/311 |
| 3,777,303 | A | * | 12/1973 | McDonough | 439/857 |
| 4,803,599 | A | * | 2/1989 | Trine et al. | 362/249 |
| 5,463,502 | A | * | 10/1995 | Savage, Jr. | 359/819 |
| 5,918,966 | A | * | 7/1999 | Arnold | 362/255 |

* cited by examiner

*Primary Examiner*—Neil Abrams

(57) ABSTRACT

In a fixation structure for fixing a lamp on a printed circuit board (PCB), a connection end of the lamp is received within a connection hole of the PCB and a sleeve having approximately cone shape is disposed between the lamp and the PCB. When the connection end of the lamp is continuously inserted into the connection hole of the PCB, a contact area between the connection end and the connection hole is increased, thereby effectively enhancing a contact-and-on performance of the lamp and the PCB. Sleeves may be located on lamps leads or alternatively placed in the connection hole of the PCB.

2 Claims, 4 Drawing Sheets

FIXATION STRUCTURE FOR FIXING A LAMP ON A PRINTED CIRCUIT BOARD

BACKGROUND OF THE INVENTION

1. Field of the Invention

The present invention relates to a fixation structure for fixing a lamp on a printed circuit board (PCB), which can effectively increase a contact area between the lamp and the PCB and thus enhance a contact-and-on performance of the lamp and the PCB.

2. Description of the Prior Art

Referring to FIG. 1, a schematic diagram of an assembly of a lamp and a printed circuit board (PCB) associated therewith used in the prior art is depicted therein. As shown, a connection wire 12 is connected to a connector 111 on the PCB 11 at one end and a connection end 131 of the lamp 13 at the other end. Referring to FIG. 2A and FIG. 2B, schematic diagrams of another assembly of a lamp and a printed circuit board (PCB) associated therewith used in the prior art is depicted therein. As shown, a slot 211 is formed on a PCB 21 and a connector 22 is disposed on the slot 211. A reed 221 is disposed at an inner side of the connector 22. The lamp 23 has a connection end 231 disposed within the connector 22 through the slot 211 of the PCB 21. The connection end 231 of the lamp 23 is gripped by the reed 221 in the connector 22. As such, the lamp 23 will be turned on only when the reed 221 is curved to grip the connection end 231 of the lamp 23. In this specification, the lamp 23 is referred to as being contact-and-on when it is turned on due to the contact through the reed 221 with the connector 22 at the PCB side 21. In this manner, it is inconvenient to handle the connection of the connection wire. Also, the gripping structure takes up a large space and is difficult to be assembled and thus results in an increased cost.

In view of the above, the conventional combination of the lamp and PCB still has its drawback. To solve these problems, the inventor of the present invention have paid a lot of effort and finally set forth a fixation structure for fixing a lamp on a PCB.

SUMMARY OF THE INVENTION

The present invention is to provide a fixation structure for fixing a lamp on a printed circuit board (PCB), in which a reed is disposed between the lamp and the PCB to effectively increase a contact area therebetween and enhance a contact-and-on performance of the lamp and the PCB.

The present invention is to provide a fixation structure for fixing a lamp on a PCB, which is simple in structure and low in manufacturing cost and can be assembled rapidly.

In accordance with an embodiment of the present invention, the fixation structure for fixing a lamp on a PCB is characterized in that the lamp has a connection end having a reed sleeved thereon and the PCB has a connection hole formed thereon, wherein the connection end of the reed is inserted into the connection hole of the PCB. Since the reed provide resilience, a contact area of the connection end and the connection hole is increased and thus a contact-and-on performance of the lamp and the PCB is enhanced.

In accordance with an embodiment of the present invention, the fixation structure for fixing a lamp on a PCB is characterized in that the lamp has a connection end thereon and the PCB has a connection hole formed thereon for receiving the connection end of the lamp and having a reed sleeved thereinto, the reed having a stop portion extending therefrom, the stop portion urging an external portion of the connection hole of the PCB, wherein the connection end of the lamp is inserted into the connection hole having the reed of the PCB. Since the reed provide resilience, a contact area of the connection end and the connection hole is increased and thus a contact-and-on performance of the lamp and the PCB is enhanced. Further, since the stop portion can prevent the connection end of the lamp from being inserted too deep into the connection hole of the PCB and thus prevent the reed from loosing from the connection hole of the PCB.

These features and advantages of the present invention will be fully understood and appreciated from the following detailed description of the accompanying drawings.

DETAILED DESCRIPTION OF THE PREFERRED EMBODIMENT

Figure 1:
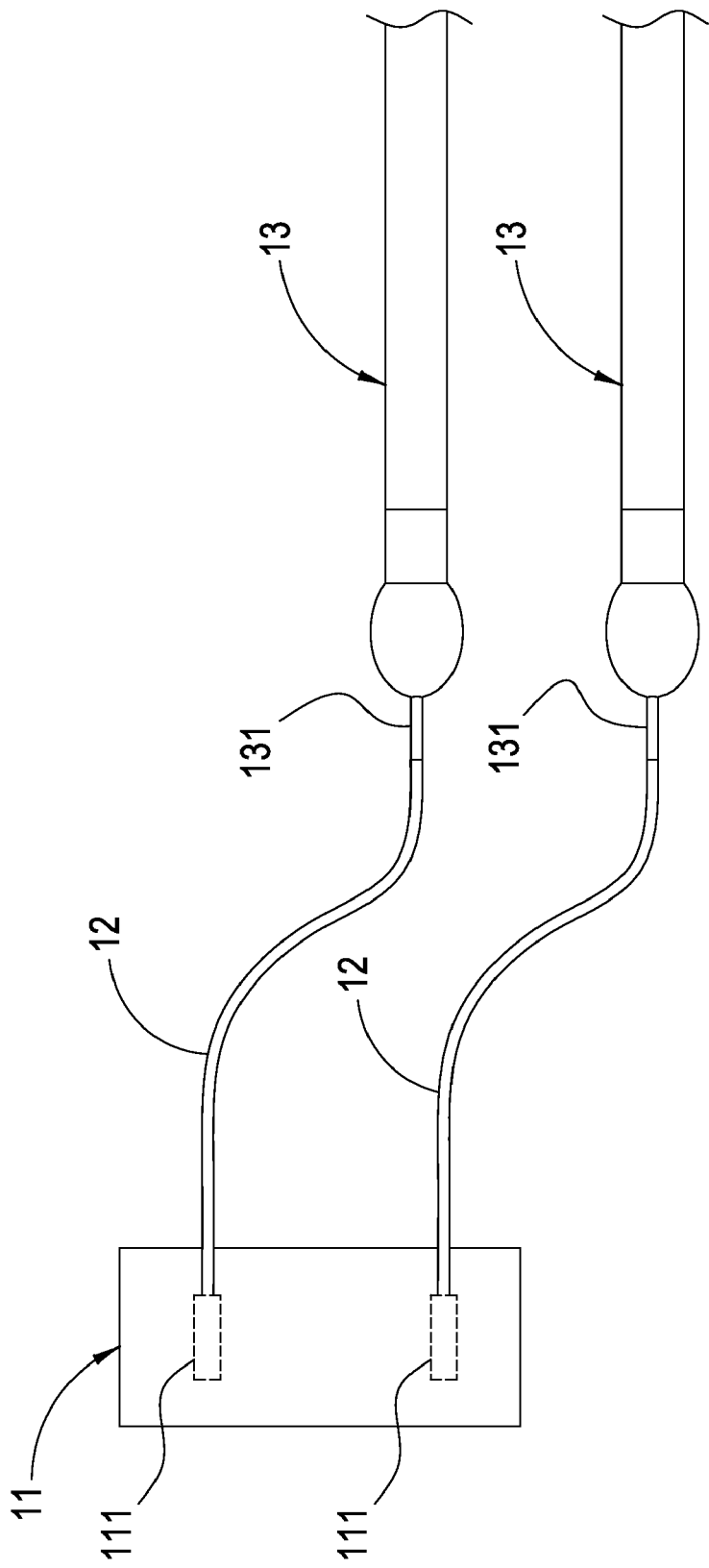
FIG. 1 is a schematic diagram of an assembly of a lamp and a printed circuit board (PCB) associated therewith used in the prior art.
Figure 2:
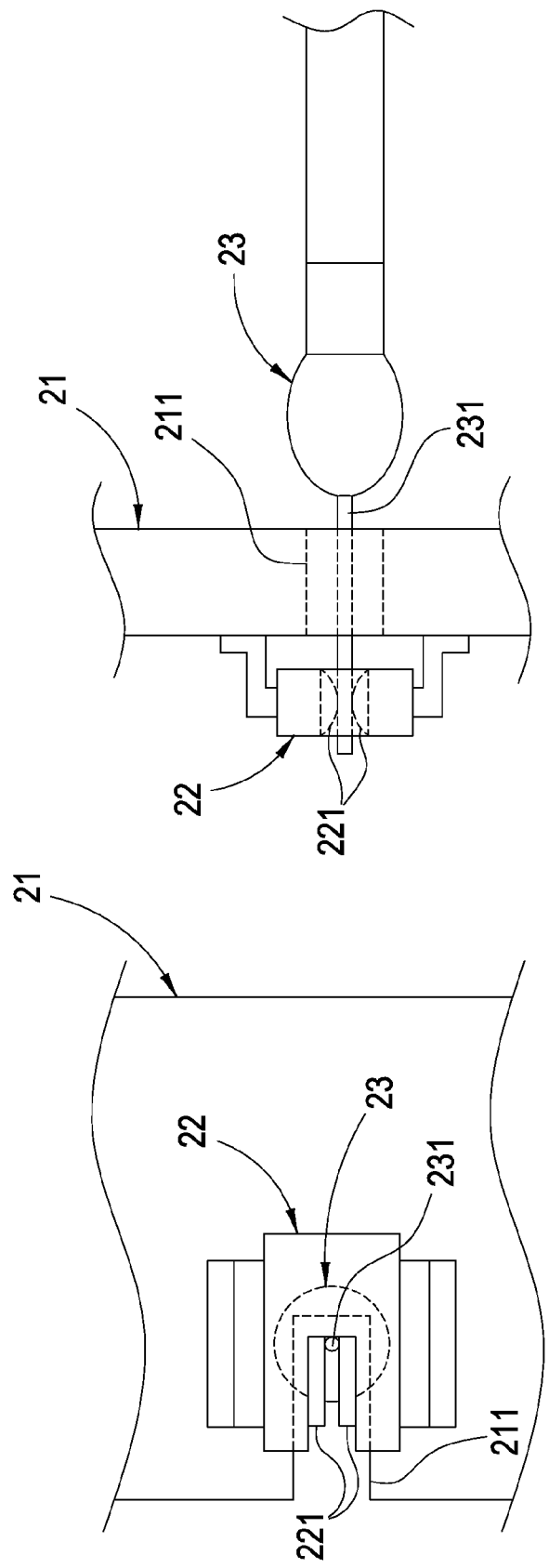
FIG. 2A and FIG. 2B are schematic diagrams of an assembly of a lamp and a PCB associated therewith used in the prior art.
Figure 3:
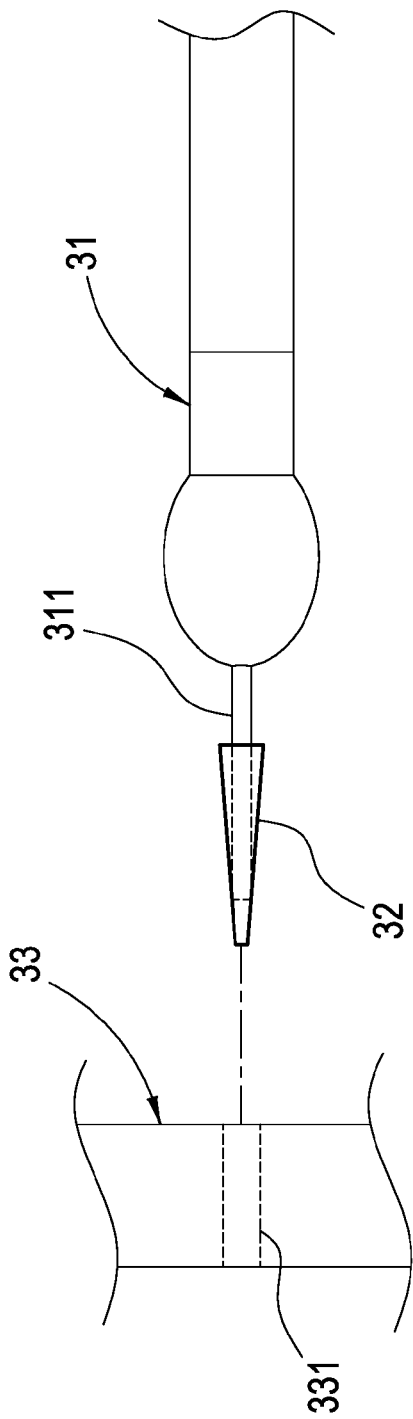
FIG. 3A and FIG. 3B are side views of a fixation structure for fixing a lamp on a PCB according to an embodiment of the invention.
Figure 3:
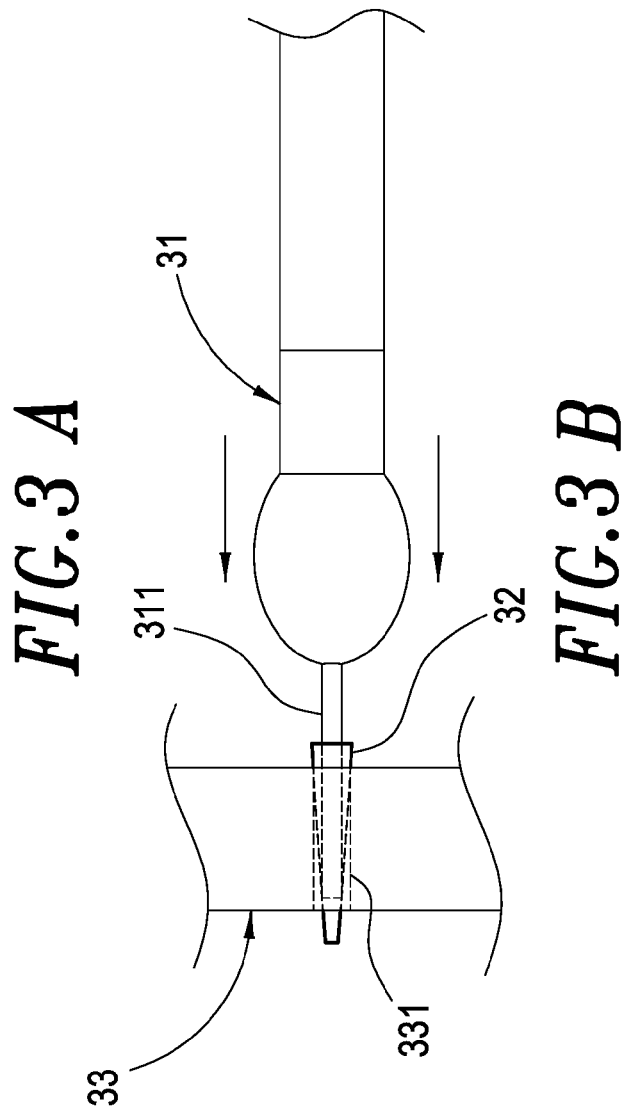

Referring to FIG. 3A and FIG. 3B, side views of a fixation structure for fixing a lamp on a PCB according to an embodiment of the invention are depicted therein. The fixation structure for fixing a lamp on a PCB comprises the lamp 31 and the PCB 33. The lamp 31 has a connection end 311. On the connection end 311, a reed such as a sleeve 32 having approximately a cone shape is disposed. On the PCB 33, a connection hole 331 is formed for receiving the connection end 311 of the lamp 31.

In the fixation structure, since the reed 33 inserted into the connection hole 331 has resilience, a contact area between the lamp 31 and the PCB 33 is increased. Thus, there is an enhanced contact-and-on performance of the lamp 31 and the PCB 33.

Figure 4:
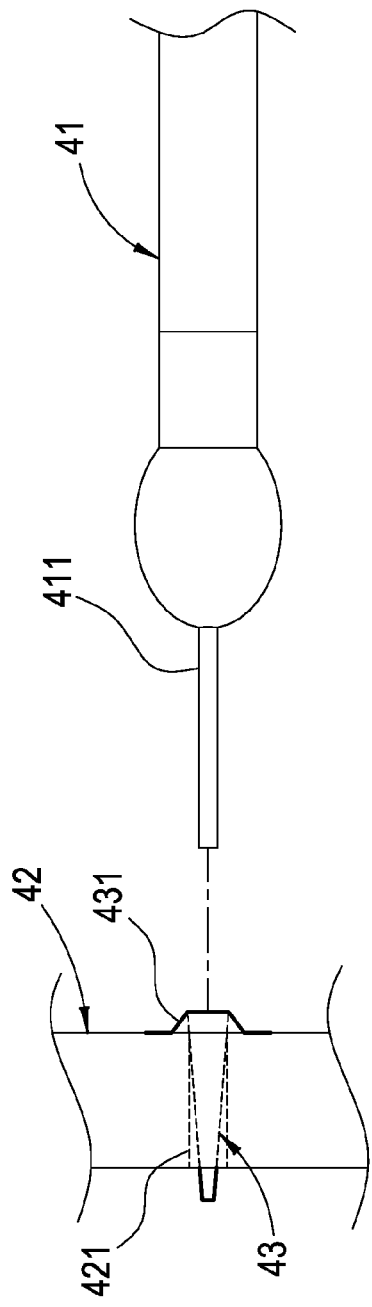
FIG. 4A and FIG. 4B are side views of the fixation structure for fixing a lamp on a PCB according to another embodiment of the invention.
Figure 4:
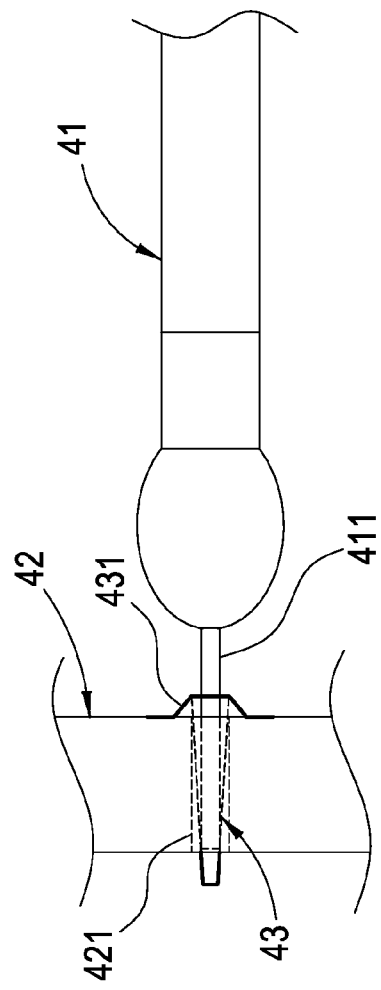

Referring to FIG. 4A and FIG. 4B, side views of a fixation structure for fixing a lamp on a PCB according to another embodiment of the invention are depicted therein. The fixation structure for fixing a lamp on a PCB comprises the lamp 41 and the PCB 42. The lamp 41 has a connection end 411. On the PCB 42, a connection hole 421 is formed for receiving the connection end 411 of the lamp 41. A reed such as a sleeve 43 having approximately a cone shape is sleeved into the connection hole 421. The reed 43 has a stop portion 431 extending outwards therefrom and urges an outer portion of the connection hole 421 of the PCB 42.

In this embodiment, the connection end 411 of the lamp 41 is inserted into the connection hole 421 with the reed 43 sleeved thereinto. The resilience of the reed 43 is also relied on to increase a contact area between the connection end 411 and the connection hole 421. Further, a stop portion 431 of the reed 43 urges the outer portion of the connection hole 421 of the PCB 42 so that the connection end 411 of the lamp 41 can be prevented from being inserted too deep into the connection hole 421 of the PCB 42 and thus the reed 43 can be prevented from loosing from the connection hole 421 of the PCB 42.

The improved winding base structure of a transformer has the following advantages in view of another conventional technology:

1. The provision of the reed between the lamp and the PCB effectively increases the contact area and thus enhances the contact-and-on performance of the lamp and the PCB.

2. The fixation structure for fixing a lamp on a PCB is simple in structure, low in manufacturing cost and can be assembled rapidly.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A fixation structure for fixing a lamp on a printed circuit board (PCB), characterized in that:

the lamp has a connection end having a resilient cone-shaped sleeve sleeved thereon and the PCB has a connection hole formed thereon, wherein a contact-and-on performance of the lamp and the PCB is enhanced by increasing contact area of the sleeve and the connection hole when the connection end of the sleeve is inserted into the connection hole of the PCB.

2. A fixation structure for fixing a lamp on a printed circuit board (PCB), characterized in that:

the lamp has a connection end thereon and the PCB has a connection hole formed thereon for receiving the connection end of the lamp and having a resilient cone-shaped sleeve inserted thereinto, the sleeve having a stop portion extending therefrom for preventing the connection end of the lamp from being inserted too deep into the connection hole of the PCB, the stop portion pressing on an external portion of the connection hole of the PCB, wherein the connection end of the lamp is inserted into the sleeve inside the connection hole of the PCB.

* * * * *